United States Patent [19]

Smayling et al.

[11] Patent Number: 5,715,195
[45] Date of Patent: Feb. 3, 1998

[54] PROGRAMMABLE MEMORY VERIFY "0" AND VERIFY "1" CIRCUIT AND METHOD

[75] Inventors: Michael C. Smayling, Missouri City, Tex.; Giulio Marotta, Contigliano, Italy; Giovanni Santin, Santa Rufina, Italy; Pietro Piersimoni, Fabriano, Italy; Cristina Lattaro, Rieti, Italy

[73] Assignee: Texas Instruments Incorporated, Dallas, Tex.

[21] Appl. No.: 683,943

[22] Filed: Jul. 19, 1996

Related U.S. Application Data

[60] Provisional application No. 60/001,241, Jul. 19, 1995.
[51] Int. Cl.⁶ .................................................. G11C 11/34
[52] U.S. Cl. .................................. 365/185.22; 365/185.21
[58] Field of Search ........................... 365/185.22, 185.21

[56] References Cited

U.S. PATENT DOCUMENTS 5,163,021  11/1992  Mehrotra et al. ............... 365/185.22
5,539,690   7/1996  Talreja et al. .................... 365/185.22
5,570,315  10/1996  Tanaka et al. ................... 365/185.18

*Primary Examiner*—David C. Nelms
*Assistant Examiner*—Michael T. Tran
*Attorney, Agent, or Firm*—J. Dennis Moore; James C. Kesterson; Richard L. Donaldson

[57] ABSTRACT

A method for automatically detecting and correcting the underprogramming of a memory cell 10 in a non-volatile, programmable memory array 1, the array having a plurality of such cells, each such cell being programmable by a programming step that stores charge therein and being erasable by an erasing step that removes charge therefrom, and each such cell being readable to determine whether such cell is in a programmed state or in an erased state. First, charge is stored in a selected cell therein 74. Then the selected cell is read to determine whether the selected cell is programmed 78. If the step of reading does not determine such cell to be programmed 80, the steps of storing and reading are automatically repeated until either the step of sensing indicates a sufficiently programmed cell or, alternatively, until a predermined number of iterations of the steps has been performed 86.

8 Claims, 3 Drawing Sheets

FIG. 3
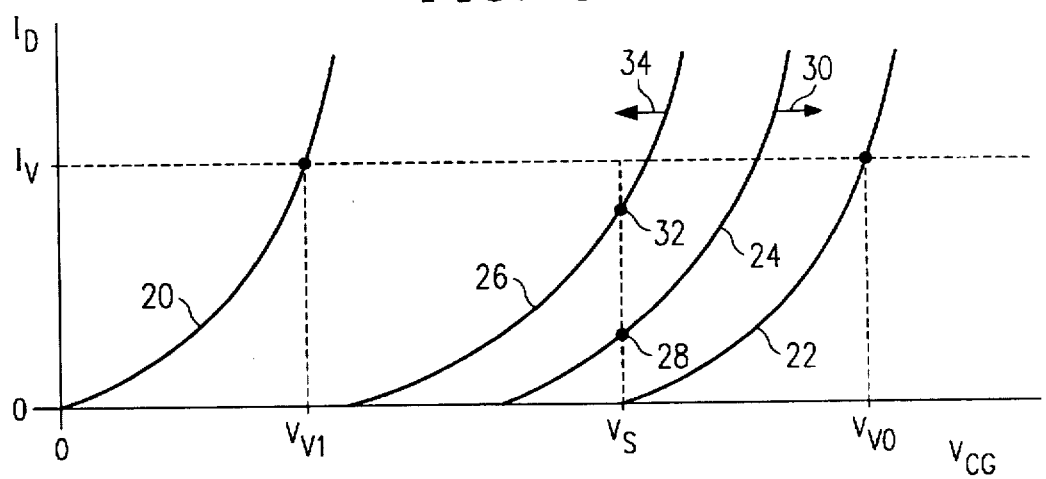
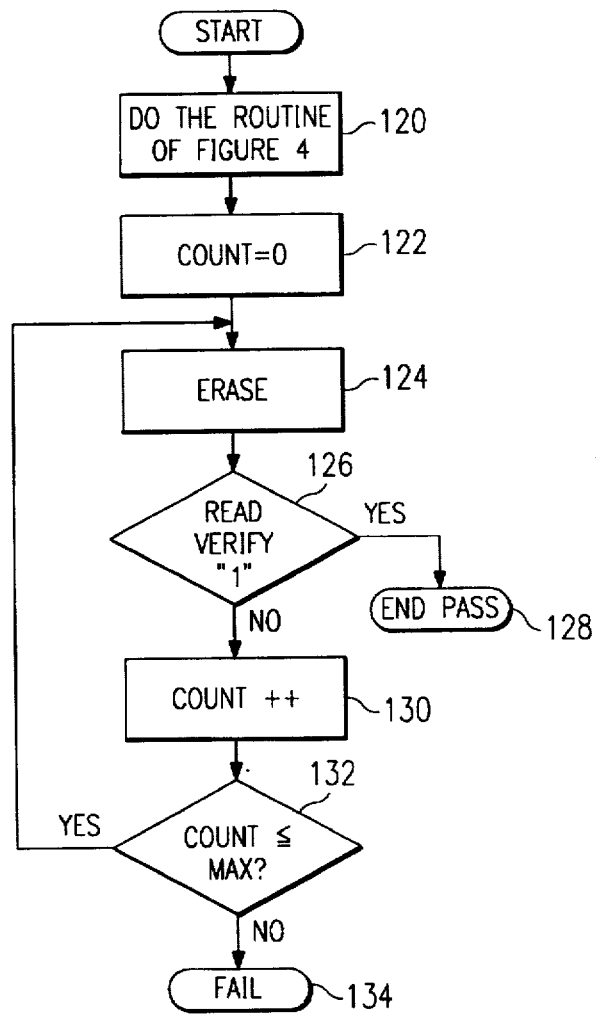
FIG. 5

PROGRAMMABLE MEMORY VERIFY "0" AND VERIFY "1" CIRCUIT AND METHOD

This application claims priority under 35 USC 119(c)(1) of provisional application Ser. No. 60/001,241, filed Jul. 19, 1995.

TECHNICAL FIELD OF THE INVENTION

This invention relates to non-volatile, programmable memory, such as FLASH memory, and more particularly relates to a circuit, and method for using same, for detecting and correcting underprogramming and undererasing of cells therein.

BACKGROUND OF THE INVENTION

Several types of programmable, non-volatile memory cells are known and used today. The Erasable programmable Read Only Memory, or EPROM, cells are memory cells including a field effect transistor, or FET device, that is provided with a floating gate that can be charged, on a non-volatile basis, with electrons using avalanche injection. A device having such a charged floating gate will not conduct, even when its control gate has a positive, read-level voltage applied thereto, while one not having such a charged floating gate will conduct when such voltage is applied to its control gate. Thus, an array of such cells can be selectively programmed.

The charge in such a cell remains on the floating gate indefinitely, for all practical purposes, unless the array is erased. Such arrays are erased by the application of ultra-violet radiation thereto.

The Electrically Erasable programmable Read Only Memory, or EEPROM, cells are memory cells that are similar to EPROMs in that they include an FET device that is provided with a floating gate that can be charged with electrons using Fowler-Nordheim tunneling, but, unlike EPROMs, each cell can be individually erasable electrically. EEPROM arrays are thus more flexible than EPROM arrays, but are significantly larger than EPROM arrays.

Finally, Flash EPROMS, sometimes referred to as Flash memories, also have a floating gate that can be charged using avalanche injection. However, Flash EPROM cells are erasable using Fowler-Nordheim tunnelling, an electrical effect rendering unnecessary the application of light to the array. In Flash EPROM arrays, as in EPROM arrays, the entire array is erased, rather than individual cells as with EEPROMs. Sectored arrays, allowing erasures of selected cells, can also be achieved in a FLASH architecture. In addition, some FLASH memories can be both programmed and erased using Fowler-Nordheim tunnelling.

All of the above-mentioned arrays are referred to collectively herein as Non-Volatile programmable Arrays, or NVPAs.

A disadvantage of all of these NVPA arrays is that, while they require timed operations for correct programming, they do not have any mechanism for detecting and correcting undererased or underprogrammed bits or, for that matter, overerased bits. This can lead to the scrapping of an otherwise usable integrated circuit (IC) including such an array, or, worse yet, the failure of such an array to perform properly in the field.

Accordingly, it is desired to have the capability to verify the "1" and "0" states of the cells in NVPA arrays, and to modify the charge on cells failing such verification so as to change them to their proper state. The present invention provides this capability.

SUMMARY OF THE INVENTION

According to the present invention there is provided a method for automatically detecting and correcting the underprogramming of a memory cell in a non-volatile, programmable memory array, the array having a plurality of such cells, each such cell being programmable by a programming step that stores charge therein and being erasable by an erasing step that removes charge therefrom, and each such cell being readable to determine whether such cell is in a programmed state or in an erased state. First, charge is stored in a selected cell therein. Then the selected cell is read to determine whether the selected cell is programmed. If the step of reading does not determine such cell to be programmed to the proper level, the steps of storing and reading are automatically repeated until either the step of sensing indicates a sufficiently programmed cell or, alternatively, until a predermined number of iterations of the steps has been performed.

According to another aspect of the invention there is provided a method for automatically detecting and correcting the undererasing of a memory cell in a non-volatile, programmable memory array, the array having a plurality of such cells, each such cell being programmable by a programming step that stores charge therein and being erasable by an erasing step that removes charge therefrom, and each such cell being readable to determine whether such cell is in a programmed state or in an erased state. First, charge is removed from a selected cell in the array. Then, the selected cell is read to determine whether the selected cell is erased to the proper level. If the step of reading does not determine such cell to be erased, the steps of storing and reading are automatically repeated until either the step of sensing indicates a sufficiently erased cell or, alternatively, until a predermined number of iterations of the steps has been performed.

These and other features of the invention that will be apparent to those skilled in the art from the following detailed description of the invention, taken together with the accompanying drawings.

DESCRIPTION OF THE DRAWINGS

FIG. 3 is a current/voltage diagram showing the drain current versus control gate voltage curves for four different cell states;

FIG. 5 is a flow chart showing the steps involved in erasing a cell according to the preferred embodiment of the present invention.

DETAILED DESCRIPTION OF THE INVENTION

Figure 1:
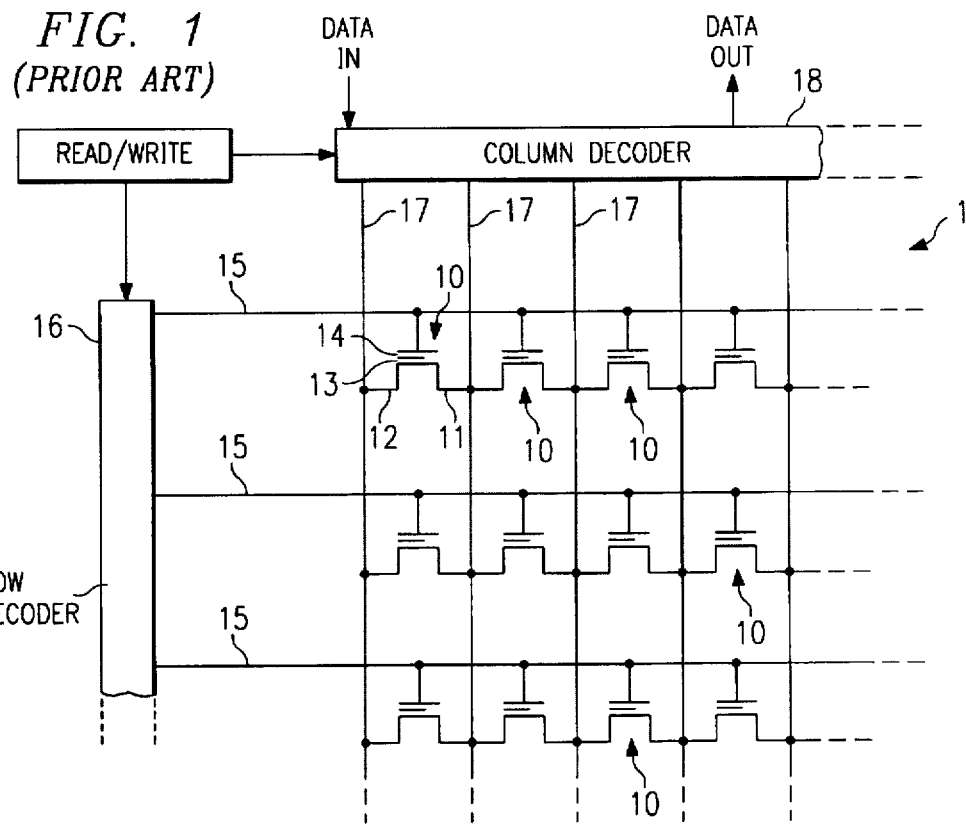
FIG. 1 is a schematic diagram of a FLASH memory circuit.

FIG. 1 is a schematic diagram of a conventional FLASH memory array 1. A detailed description of such an array 1 can be found in, for example, U.S. Pat. No. 4,996,668, entitled "Erasable programmable Memory," which issued on Feb. 26, 1991 to J. L. Paterson, et al., and which is commonly assigned. The array 1 includes a regular arrangement of individual cells 10, each such cell 10 being an n-channel, enhancement type metal-oxide-semiconductor field effect transistor (MOSFET), having a source 11, a drain 12, a chargeable floating gate 13 and a control gate 14.

All of the control gates 14 in a row of cells 10 are connected to a row address line, or wordline, 15, and all of the wordlines 15 are connected to a row decoder 16. All of the source and drain electrodes, 11 or 12, in a column of cells are connected to a column line, or bitline, 17, and the source and drain bitlines 17 are connected to a column decoder 18.

A bit of information is stored in cell 10 by placing a sufficient amount of charge on floating gate 13 so as to raise the threshold voltage Vt for the cell 10 to overcome the positive control gate voltage applied during a read operation: with no net charge or a net positive charge on floating gate 13 the threshold voltage Vt for the cell 10 is low, and with a substantial net negative charge on floating gate 13 the threshold voltage is high. The state of cell 10 is determined to be programmed or erased by applying a positive voltage to one of the bitlines 17, while leaving the other bitlines 17 grounded, applying a control gate voltage $V_{CG}$ which is between the high and low threshold voltages, normally at the level of the supply voltage $V_{DD}$ (e.g., +5 volts), to the wordline 15 connected to control gate 14 of the selected cell 10, and 0 volts to all other wordlines 15, and sensing the drain current $I_D$ flowing through the channel of the selected cell 10. The programmed state for a cell is taken to be the state with a high Vt (substantial net negative charge on floating gate 13), in which no $I_D$ is sensed, and the erased state is taken to be the state with a low Vt, in which a sufficient level of $I_D$ to verify erasure, designated $I_V$, is sensed.

Figure 2:
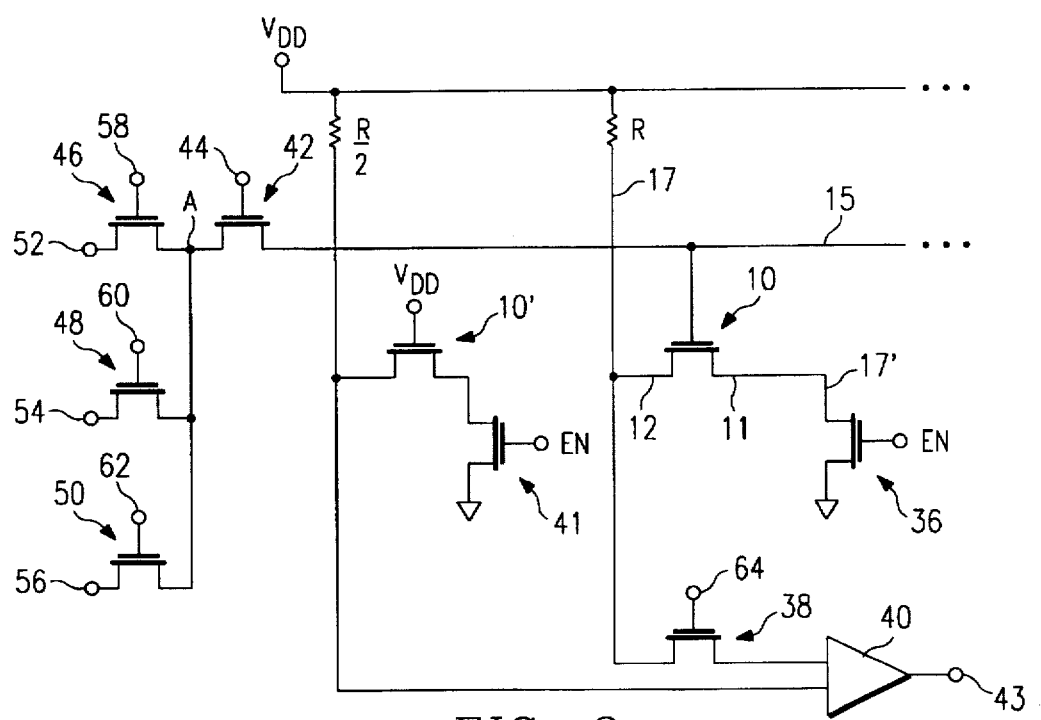
FIG. 2 is a schematic diagram of a portion of the circuit shown in FIG. 1.

This determination of the state of a cell 10 can be better understood by reference now to FIG. 2, which shows a portion of the circuit of FIG. 1, plus additional circuitry not shown in FIG. 1. A cell 10 is shown having its drain 12 connected to a bitline 17, and its source 11 connected to a bitline 17'. The bitline 17 is connected through a resistor R to the supply voltage VDD, while the bitline 17' is connected through an FET device 36 to ground. An enable signal EN turns device 36 on, providing a ground path for bitline 17' to enable operation of cell 10 when the wordline 15 connected to the control gate of cell 10 is activated. The bitline 17 is connected through an FET device 38 to one input of a differential amplifier 40 that serves as the sense amplifier for the cell 10.

Another cell 10', which is a "dummy cell", is also shown in FIG. 2. Every array 1 (FIG. 1) has one such dummy cell 10', to provide a reference $I_D$, as described hereinabove. The drain of cell 10' is connected to a bitline 17", which is connected through a resister R/2, having half the resistance of resistor R, to VDD, and which is connected directly to the other input of differential amplifier 40. The source of cell 10' is connected through an FET device 41 to ground. The enable signal EN turns device 41 on, providing a ground path for bitline 17" to enable operation of cell 10', its control gate being connected to Vdd, as shown.

The wordline 15 is connected through a FET device 42, serving as a pass-gate, to a node A. The gate connection 44 of device 42 is provided with an enable signal from row decoder 16 (FIG. 1) to activate wordline 15 (FIG. 2) by connecting the voltage at node A through device 42 to wordline 15. The node A can be placed at one of three different voltages, as follows. Three FET devices 46, 48, 50, have one of their source or drain connected to node A, with the other of their source or drains being connected to a port 52, 54, 56, respectively, and having gate connections 58, 60, 62, respectively. Port 52 is connected to Vdd, which is the normal Read voltage for the control gates of cells 10. Port 54 is connected to the reference voltage $V_0$. Port 56 is connected to the reference voltage $V_1$. The devices 46, 48, 50, are activated by the application of a control voltage at, e.g., VDD or higher, to their control gates 58, 60, 62, respectively. Thus, by applying a control voltage to connection 58, the normal Read voltage Vdd is applied to node A, and thereby to the wordline 15 when device 42 is activated. By applying a control voltage to connection 60, the reference voltage $V_0$, is likewise applied to the wordline 15. By applying a control voltage to connection 62, the reference voltage $V_1$, is likewise applied to the wordline 15. Thus, any one of VDD, $V_0$ $V_1$, can be applied selectably to the wordline 15.

Note that voltages $V_0$ and $V_1$ can be generated either on-chip or off-chip, that is, either derived by circuitry on the same chip as the array 1 or provided by a voltage supply external to the array 1 chip. Both $V_0$ and $V_1$ can be derived on chip from a band gap reference generator. $V_1$ can be derived by applying the output of the band gap reference generator to an op amp. $V_0$ can be derived by applying the output of the band gap reference generator to one input of a differential amplifier, the output of which is provided to a charge pump providing $V_0$ as the output thereof, with negative feedback being provided to the other input of the differential amplifier, derived from $V_0$ through a resistive divider. Both circuit techniques for deriving $V_1$ and $V_0$ are well known.

In operation, if the floating gate of cell 10 is charged as the result of proper programming as described hereinabove, when the wordline 15 has the Read voltage VDD applied to it no current $I_D$ flows through cell 10, and therefore the sense voltage on bit line 17 remains at VDD. This voltage is applied to the input of differential amplifier 40 by enabling device 38, by applying a control signal to its gate connection 64. Normally, this gate connection 64 is activated by the column decoder 18 (FIG. 1). The output of differential amplifier 40 will be at, e.g. a "0" state, indicating that the voltage sensed on cell 10 is greater than the voltage sensed on the dummy cell 10'.

On the other hand, if the floating gate of cell 10 is not charged as described hereinabove, when the wordline 15 has the Read voltage VDD applied to it, a finite sense current $I_d$ flows through cell 10 which, in normal operation is somewhat lower than the current flowing through the dummy cell 10'. This results in a lower voltage being developed on bit line 17 than on bit line 17", because these currents flow, respectively, through R and R/2. Therefore, the output of differential amplifier 40 will be at, e.g. a "1" state, indicating that the voltage sensed on cell 10 is less than the voltage sensed on the dummy cell 10'.

So long as the sense current $I_D$ is greater than the current $I_V$ flowing through the dummy cell 10' the output of differential amplifier 40 will be at the "1" state. When the sense current $I_D$ drops below $I_V$, which occurs when the floating gate is charged adequately, the output of differential amplifier 40 will be at the "0" state.

In like manner, the voltages $V_0$ and $V_1$, can be applied selectably to the wordline 15 and the circuit of FIG. 2 used to sense whether the $I_D$ current flowing through a cell 10 is above or below $I_V$.

FIG. 3 is a current/voltage graph of drain current $I_D$ versus control gate voltage $V_{CG}$ for a cell 10 (FIG. 1 or FIG. 2). The graph includes curves 20, 22, 24, 26, for four different cell states. Three voltage points significant to an understanding of the preferred embodiment of the present invention are shown on the horizontal axis. $V_S$ is the level of $V_{CG}$ applied to a cell 10 when in normal read mode. $V_1$ is the level of $V_{CG}$ applied during a first special verification mode, described in detail below, for verifying the erased, or "1" state of a cell 10. $V_0$ is the level of $V_{CG}$ applied during a second special verification mode, described in detail below, for verifying the programmed, or "0" state of a cell 10. $I_V$ is the sense current level used in these two verification modes.

Curve 20 corresponds to the behavior of a cell 10 in a properly erased state, while curve 22 corresponds to the behavior of a cell 10 in a properly progrommed state. It will be appreciated that when $V_S$ is applied to the control gate 14 in a properly programmed state, essentially no current $I_d$ flows, while in the erased state an $I_D$ current greater than $I_v$ flows.

Curve 24 corresponds to the behavior of a cell 10 that is insufficiently programmed, that is, insufficient charge has been stored on its floating gate. As can be seen, when $V_S$ is applied to the control gate 14 of such a cell, a finite current, represented by point 28 on the curve 24, flows. If sufficiently high, this finite current may drive the sense amplifier 40 (FIG. 2) associated with the cell 10, and thereby produce an invalid read of the cell state. The preferred embodiment of the present invention provides an arrangement by which curve 24 (FIG. 3) can be "moved" in the direction of arrow 30, to at least the place of curve 22 on the graph. That is, sufficient additional charge can be added to the floating gate of an insufficiently progrnmmed cell to change it to the state of a properly progrommed cell.

Likewise, curve 26 corresponds to the behavior of a cell 10 that is insufficiently erased, that is, insufficient charge has been removed from its floating gate 13. As can be seen, when $V_S$ is applied to the control gate 14 of such a cell, a current less than the current $I_D$ that flows through a properly erased cell, represented by point 32 on the curve 26, flows. Converse to the case of insufficient programming, this finite current may be insufficient to drive the sense amplifier, again producing an invalid read of the cell state. Similar to the case of an underprogrammed cell, the preferred embodiment of the present invention provides an arrangement by which curve 26 can be "moved" in the direction of arrow 34, to at least the place of curve 20 on the graph. That is, sufficient additional charge is driven from the floating gate 13 of the cell to discharge it to the state of a properly programmed cell. Note that removing negative charge from the floating gate during erasing may discharge the floating gate completely. In fact, the erase operation may remove negative charge to the extent that the floating gate becomes positively charged.

The preferred embodiment of the present invention provides the means by which the improper programming or erasure of a cell 10 can be detected, and the means by which the charge state of the cell is corrected. As a general mattor, the way in which detection occurs is, in the case of verification of proper programming level, by the application of a voltage $V_0$, higher than $V_S$, in the preferred embodiment being about +6 volts, and then sensing whether the $I_D$ is at or below $I_V$. If it is, the cell passes; if not, a fail is signalled. Signalling of such pass or fail may be performed by any of many ways. Most easily, a bit is set in a status register associated with the array.

Likewise, the way in which detection occurs is, in the case of verification of proper erase level, by the application of a voltage $V_1$, lower than $V_S$, in the preferred embodiment being about +3 volts, and then sensing whether the $I_D$ is at or above $I_V$. If it is, the cell passes; if not, a fail is signalled.

Signalling of such pass or fail may be performed in the same manner as in the case of progrsmming, again most easily, by the setting of a bit in a status register associated with the array.

Once a fail has been signalled for a cell 10, the way in which the curves 20 and 22 are moved as described hereinabove, i.e., the way in which the charge state of the corresponding cell 10 is modified to the proper level, is by the controlled addition or reduction of charge on the floating gate 13 of the affected cell 10. Charge is added using the same circuitry as in normal programming, under control of a first routine that assures that additional charge is added, but only a sufficient amount. Charge is reduced using the same circuitry as in normal erasure, under control of a second routine that assures that additional charge is reduced, but, again, only a sufficient amount. The first and second routines are shown in flow chart form in FIGS. 4 and 5, respectively.

Figure 4:
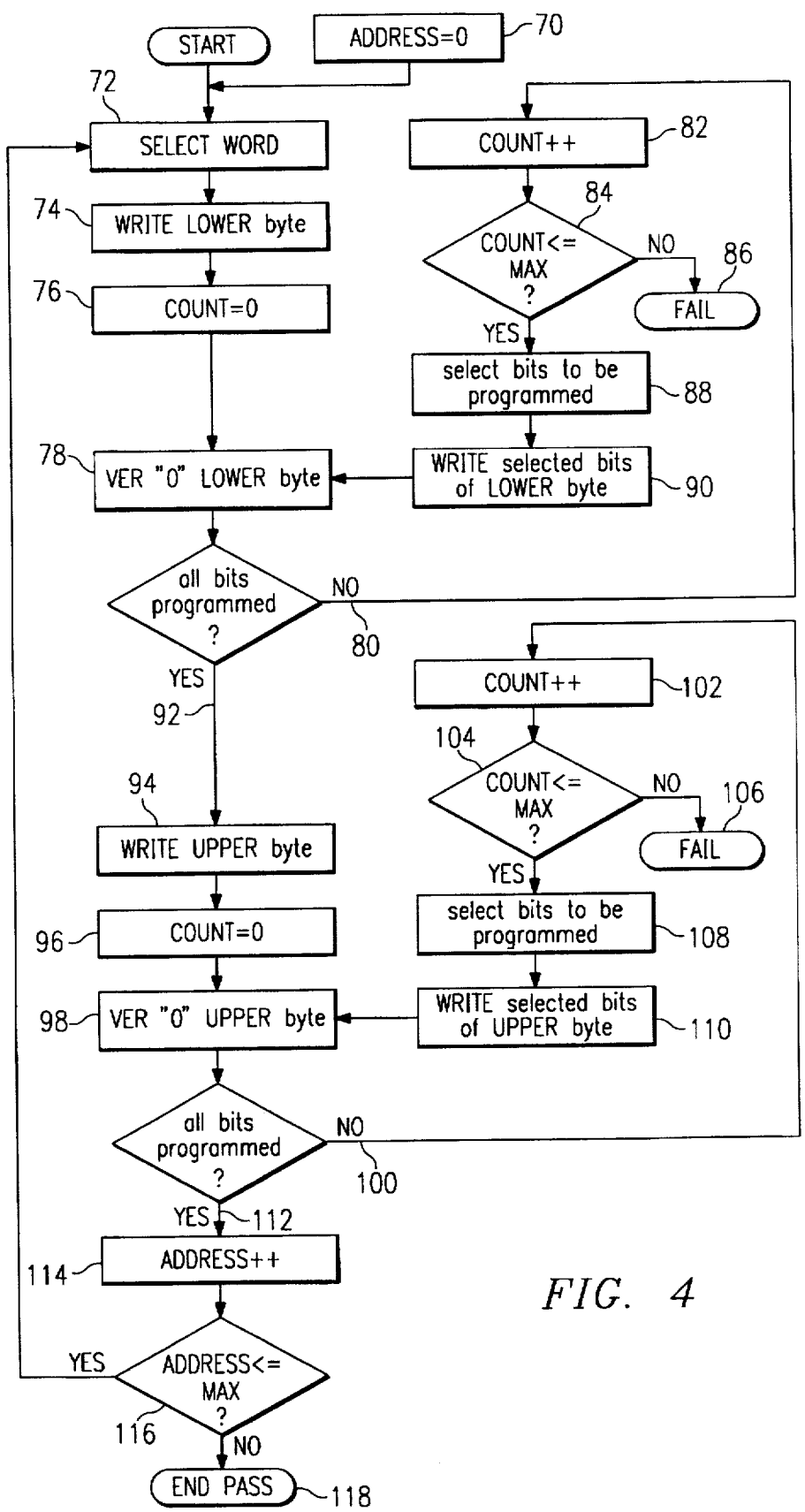
FIG. 4 is a flow chart showing the steps involved in programming a cell according to the preferred embodiment of the present invention.

Referring now to FIG. 4, the steps of the first routine, for correcting underprogramming, are as follows. The routine is started, and an address counter (not shown) for the array is re-set to zero 70 to prepare the way for the entire array to be operated on. Note that this address counter can be the standard address counter used for the array for normal read or write operation. A group of sixteen cells 10 (a word) is selected 72, all eight bits in the lower byte are programmed (written) 74, and the write counter (not shown) is reset to zero 76. The lower byte is then read to verify that all cells in the lower byte of the selected word read as "0", i.e., all of the lower byte bits were, in fact, adequately programmed. Note that the pattern of bits to be written into the selected cells need not be all "0s". If the exact patten of bits to be programmed into the array when used is known, then that pattern can be written into the cells in step 74. In such case, step 78 is modified to entail reading the actual pattern of bits written into the byte of selected cells, rather than all "0s".

If the result of step 78 is that the bits written to are not read, i.e., are not sufficiently programmed 80, then a subroutine is entered to correct the underprogrsmming.

In that subroutine, first a cell fail count, which has a zero initial value and reset value, is incremented by one 82. Note that this is a value that can be stored in main memory by software instructions in accordance with well known techniques. Alternatively, the value could be stored in specialized hardware, such as a register, or counter. The cell fail count is then checked 84 to determine whether the count has reached the maximum count. This maximum count, which in the preferred embodiment is twenty five, is a value selected to allow re-charging of cells within a predetermined range of performance parnmeters, but which cuts off the process after a number of attempts to correct the charge on the affected cell sufficient to correct a cell in such range fails, revealing that the cell is effectively uncorrectable. If such maximum count is exceeded, a byte program fail is signalled 86 is generated, e.g., by the setting of a bit in a status register.

On the other hand, if the count is not exceeded, the failing bits are selected 88, and are selectively written 90 once again, which boosts the charge on their floating gates. The lower byte is then read again to verify that all cells in the lower byte of the selected word read as "0" 78, i.e., all of the lower byte bits are now, in fact, programmed. If not, the subroutine just described 82, 84, 86, 88, 90, is re-entered.

On the other hand, if the programming of all bits in the lower byte is verified 92, then all eight bits in the upper byte are adequately programmed (written) 94, and the write counter (not shown) is reset to zero 96. The upper byte is then read to verify that all cells in the upper byte of the selected word read as "0" 98, i.e., all of the upper byte bits were, in fact, adequately programmed. If not 100, a subroutine is entered to correct the undererasure.

In that subroutine, first the cell fail count is incremented by one 102. The cell fail count is then checked 104 to determine whether the count has reached the aforementioned marlmum count, i.e., twenty five in the preferred embodiment. If the count is exceeded, a byte program fail is signalled 106 is generated, e.g., by the setting of a bit in a status register.

On the other hand, if the count is not exceeded, the failing bits are selected 108, and are selectively written 110 once again, which boosts the charge on their floating gates. The lower byte is then read again to verify that all cells in the lower byte of the selected word read as "0" 98, i.e., all of the lower byte bits are now, in fact, adequately programmed. If not, the subroutine just described 102, 104, 106, 108, 110, is re-entered.

On the other hand, if the programming of all bits in the lower byte is verified 112, the address counter is incremented by one 114, to allow operation on the next word. First, however, the value in the address counter is checked 116 to determine whether the maximumn address, corresponding to the highest physical word address of the array, has been exceeded. If it has, meaning that the entire array has been operated on, the verification/correction routine is ended 118. If it hasn', however, the routine proceeds 72 to the next word in the array.

At this point, the routine could continue until the entire array is operated on, or, alternatively, until a fail is detected. The former case would be utilized where back-up cell technology is employed. The addresses of all failed cells would be stored, and then the back-up cells put into place. The latter case would be utilized in the simpler case where back-up cell technology is not employed, and the array would simply be deemed defective.

Referring now to FIG. 5, the steps of the second routine, for correcting undererasing, are as follows. It will be understood that erasure is an operation done to every cell in the array 1 (FIG. 1) at the same time, generally to a programmed array. Therefore, in initial testing of an array to determine whether it passes or fails, for example, the first step 120 (FIG. 5) in the routine is to do the routine of FIG. 4 to program the array. In actual usage of the array, this first step 120 can be skipped, for example if the user simply wishes to do an initial erase of the array to prepare for programmable the array.

An erase count is set to zero 122, for example in the same manner that the cell fail count is set (see, e.g., description hereinabove in connection with step 76) and then a normal erase is performed on the array 124. The array is then read to verify that all cells read as "1" 126, i.e., all of the cells were, in fact, adequately erased. If all cells are verified to have been erased, the pass is ended 128, and the array passes. If one or more of the cells fails to be read as a "1", the erase count is incremented by one 130. The erase count is then checked 132 to determine whether the count has reached the same maximum count utilized above in connection with steps 84 and 104 (FIG. 4), i.e., twenty five in the preferred embodiment. If the count is exceeded, a fail is signalled 134. If the count is not exceeded, the routine returns to step 124, i.e., a normal erase is performed on the array and the routine continues.

Many languages are utilized by programmers of integrated circuits that have embedded arrays, such as microcontrollers, digital signal processors, and the like. The foregoing routines shown in FIGS. 4 and 5 are readily implemented in any of these languages by programmers of routine skill who have the benefit of the information contained herein.

Although the present invention and its advantages have been described in detail, it should be understood that various changes, substitutions and alterations can be made herein without departing from the spirit and scope of the invention as defined by the appended claims.

What is claimed is:

1. A method for automatically detecting and correcting the underprogramming of a memory cell in a non-volatile, programmable memory array, said array having a plurality of such cells, each such cell being programmable by a programming step that stores charge therein and being erasable by an erasing step that removes charge therefrom, and each such cell being readable in a normal read operation by the application of a predetermined voltage to a control gate thereof to determine whether such cell is in a programmed state or in an erased state, comprising the steps of:

storing charge in a selected cell therein;

reading said selected cell using a voltage applied to said control gate at a level substantially greater than said predetermined voltage, to determine whether said selected cell is programmed to the proper level;

if said step of reading does not determine such cell to be programmed to the proper level, then in response to such determination that such cell is not programmed to the proper lever repeating said steps of storing and reading until either the step of sensing indicates a sufficiently programmed cell or, alternatively, until a predetermined number of iterations of said steps has been performed.

2. A method for automatically detecting and correcting the undererasing of a memory cell in a non-volatile, programmable memory array, said array having a plurality of such cells, each such cell being programmable by a programming step that stores charge therein and being erasable by an erasing step that removes charge therefrom, and each such cell being readable in a normal read operation by the application of predetermined voltage to a control gate thereof to determine whether such cell is in a programmed state or in an erased state, comprising the steps of:

removing charge from a selected cell therein;

reading said selected cell using a voltage applied to said control gate at a level substantially less than said predetermined voltage, to determine whether said selected cell is erased to the proper level;

if said step of reading does not determine such cell to be erased to the proper level, then in response to such determination that such cell is not programmed to the proper level automatically repeating said steps of storing and reading until either the step of sensing indicates a sufficiently erased cell or, alternatively, until a predetermined number of iterations of said steps has been performed.

3. A method for detecting and correcting the underprogramming of a cell in a non-volatile, programmable memory array, said array having a plurality of cells, each cell being settable to a programmed state by the storage of charge on a floating gate thereof and being settable to an erased state by the removal of charge from said floating gate, and each cell having a control gate for reading the state of the cell by the application of a first, read voltage to said control gate and the sensing of the current, if any, that flows through the channel of said cell as a result, comprising the steps of:

operating said array to set a selected cell therein to a programmed state;

applying a second, verify 0 voltage, having a level greater than said first voltage, to the control gate of a cell;

sensing the current, if any, that flows through the channel of said selected cell to determine whether said current through said cell is no greater than a predetermined level, thereby indicating a sufficiently programmed cell;

if said step of sensing does not indicate a sufficiently programmed cell, repeating said steps of operating, applying and sensing until either the step of sensing indicates a sufficiently programmed cell or, alternatively, a maximum number of iterations of said steps has been performed, in which case indicating a failed array.

4. A method according to claim 3 wherein said memory array is implemented on a single integrated circuit chip, and further comprising the step of generating said verify 0 voltage using circuitry on the same chip as said chip on which said memory array is implemented.

5. A method according to claim 3 wherein said memory array is implemented on a single integrated circuit chip, and further comprising the step of providing said verify 0 voltage from a source external to said chip on which said memory array is implemented.

6. A method for detecting and correcting the undererasure of a cell in a non-volatile, programmable memory array, said array having a plurality of cells, each cell being settable to a programmed state by the storage of charge on a floating gate thereof and being settable to an erased state by the removal of charge from said floating gate, and each cell having a control gate for reading the state of the cell by the application of a first, read voltage to said control gate and the sensing of the current, if any, that flows through the channel of said cell as a result, comprising the steps of:

operating said array to set a selected cell therein to an erased state;

applying a second, verify 1 voltage, having a level less than said first voltage, to the control gate of a cell;

sensing the current, if any, that flows through the channel of said selected cell to determine whether said current through said cell is at least at a predetermined level, thereby indicating a sufficiently erased cell;

if said step of sensing does not indicate a sufficiently erased cell, repeating said steps of operating, applying and sensing until either the step of sensing indicates a sufficiently erased cell or, alternatively, a maximum number of iterations of said steps has been performed, in which case indicating a failed array.

7. A method according to claim 6 wherein said memory array is implemented on a single integrated circuit chip, and further comprising the step of generating said verify 1 voltage using circuitry on the same chip as said chip on which said memory array is implemented.

8. A method according to claim 6 wherein said memory array is implemented on a single integrated circuit chip, and further comprising the step of providing said verify 1 voltage from a source external to said chip on which said memory array is implemented.

* * * * *

UNITED STATES PATENT AND TRADEMARK OFFICE
CERTIFICATE OF CORRECTION

| | | |
|---|---|---|
| PATENT NO. | : 5,715,195 | |
| APPLICATION NO. | : 08/683943 | |
| DATED | : February 3, 1998 | |
| INVENTOR(S) | : Michael C. Smayling et al. | |

It is certified that error appears in the above-identified patent and that said Letters Patent is hereby corrected as shown below:

Claim 2, Column 8, Lines 51-54 change "in response to such determination that such cell is programmed to the proper level automatically repeating said steps of storing and reading" to -- in response to such determination that such cell is erased to the proper level automatically repeating said steps of removing and reading --

Column 2, Line 32 change "the steps of storing" to -- the steps of removing --

Column 5, Lines 45-46 change "the state of a properly programmed cell" to -- the state of a properly erased cell --

Signed and Sealed this
Tenth Day of May, 2011

David J. Kappos
*Director of the United States Patent and Trademark Office*